United States Patent [19]
Kjosavik

[11] Patent Number: 4,468,745
[45] Date of Patent: Aug. 28, 1984

[54] DEVICE FOR POSITION MEASUREMENT

[75] Inventor: Dag Kjosavik, Sandnes, Norway

[73] Assignee: Trallfa Underhaug A/S, Bryne, Norway

[21] Appl. No.: 325,434

[22] PCT Filed: Mar. 20, 1981

[86] PCT No.: PCT/NO81/00007
§ 371 Date: Nov. 23, 1981
§ 102(e) Date: Nov. 23, 1981

[87] PCT Pub. No.: WO81/02780
PCT Pub. Date: Oct. 1, 1981

[30] Foreign Application Priority Data
Mar. 21, 1980 [NO] Norway .................................. 800827

[51] Int. Cl.³ .......................... G01B 7/30; B25J 19/00
[52] U.S. Cl. .................................. 364/559; 364/603; 340/347 SY
[58] Field of Search ............... 364/559, 603, 815, 817; 340/347 SY; 318/562, 605, 654, 661, 636

[56] References Cited
U.S. PATENT DOCUMENTS 3,641,565  2/1972  Ivers et al. .................. 340/347 SY
3,868,680  2/1975  Rhodes ................................ 364/603
3,984,672 10/1976  Jones ........................... 340/347 SY
4,039,946  8/1977  Noca ............................. 340/347 SY
4,062,005 12/1977  Freed et al. .................. 340/347 SY
4,099,245  7/1978  Maysonett ........................... 364/603
4,119,958 10/1978  Simon et al. .................. 340/347 SY
4,164,729  8/1979  Simon et al. .................. 340/347 SY
4,270,077  5/1981  Swartz et al. ................. 340/347 SY OTHER PUBLICATIONS
"Electronic Analog/Digital Conversions" by Schmid, Published by Van Nostrand Reinhold in 1970, pp. 437-441.

Primary Examiner—Gary Chin
Attorney, Agent, or Firm—Watson, Cole, Grindle & Watson

[57] ABSTRACT

A device for measuring the angular position of a plurality of synchro or resolver mechanisms utilizes time multiplexing between different input channels. First and second multipliers have their respective outputs connected to a subtraction unit which communicates with a position calculating microprocessor via a demodulator and an analog to digital converter. The microprocessor communicates with the subtraction unit through a data bus.

3 Claims, 5 Drawing Figures

DEVICE FOR POSITION MEASUREMENT

BACKGROUND OF THE INVENTION

1. Field of the Invention

The present invention generally relates to a device for position measurement or angular measurement and more particularly relates to a device for position measurement in servo controlled mechanisms such as manipulators of industrial robots, wherein the angular position of synchros or resolvers at several measurement locations are converted into digital signals by time multiplexing.

2. Description of the Prior Art

Synchros have been used for measuring angles and providing for a remote read-off via electrical transfer of an angle signal from a measuring location to a indicating intrument. Synchros have also been used for the transfer of moments, usually small, and for the remote control of servo mechanisms.

When an angular measurement is desired to be converted into digital information, a resolver, which is a particular type of synchro is used. The resolver includes two stator windings which are shifted by 90° and one or two rotor windings. The windings may be supplied in one of two ways with A.C. voltage at for example 400 Hz.

One method supplies A.C. voltage to the two stator windings with a voltage represented by $E.\sin \omega t$ and $E.\cos \omega t$, respectively. There is then induced in the rotor windings a voltage of $k.E.(\sin \omega t.\sin \theta + \cos \omega t.\cos \theta)$ which equals $k.E.\sin(\omega t - \theta)$ wherein k is a constant. Thus, a phase modulated signal with constant amplitude is created and may be converted into digital form by a demodulator.

A second method supplies A.C. voltage to the rotor winding of the resolver with a voltage value represented by $E.\sin \omega t$. There is then induced in the stator sine winding a voltage: $k.E \sin \omega t.\sin \theta$, and in the stator cosine winding a voltage of $k.E \sin \omega t.\cos \theta$. This latter method is most frequently used today for conversion of the analog signal into digital signals.

Resolvers used for digital conversion of angular measurement are competitive with code disks which provide direct digital angular read-off information. The resolver-digital-converters are still preferred over code disks where great resolution is necessary, for example, greater than 10 bit per revolution.

Most of the available resolver-digital converters use a resolver having its rotor winding supplied with A.C. voltage as noted above. The most frequently used converter is the so-called "tracking"-converter wherein the analog sine and cosine signals from the resolver are multiplied by cosine and sine values, respectively, to the contents of an up/down counter. The output signals from the multipliers are subtracted and a modulated signal is derived representing the sine of the difference between the turning angle of the resolver and the contents of the counter.

The different signal is demodulated and through a voltage controlled oscillator provides counting pulses to the counter so that the loop is closed and the contents of the counter follows the resolver angle. Tracking converters provide high static accuracy and, are insensitive to frequency, phase and amplitude variations. Tracking converters are also insensitive to high frequency noise present on the resolver signals and provide good tracking of rapidly rotating resolvers having a substantially constant velocity and enable direct angular read-off measurements.

Another widely used construction is the so-called Successive-approximation-converter. It operates in a manner similar to the tracking converter, but instead of providing a continuous read-off of the resolver signals, the resolver signals are sampled once or twice per period. A DC voltage signal representing the sine of $(\theta-\phi)$ is formed by a sine and cosine multiplication and subtraction and is applied to a quick operating analogue/digital converter which includes a Successive-approximation register. Successive-approximation converters enable rapid conversion, which permits relatively rapid changes of the resolver speed, and provides for a direct angular read-off.

A more recent construction for converting several channels is the micro-processor-based system of MN7200 Micro Networks wherein the operation for one typical channel demodulates sine and cosine signals (AC/DC) and converts such signals into digital form separately. The micro-processor thereby receives the sine and cosine values of the resolver angle.

The micro processor calculate $\tan \theta = (\sin \theta/\cos \theta)$ and thereafter $\theta$ is derived by an arc tan table and by interpolation. This system is somewhat expensive, since one AC/DC converter is required for each channel. Low rotational speed of, for example, of the resolver 10°/sec. is acceptable before accuracy is reduced.

The said system MN2700 provides great static accuracy, is insensitive to noise and is multiplexed for several channels.

SUMMARY OF THE INVENTION

The object of the present invention is to provide for position measurement on several axes, for example, on a robot arm, where the requirements of accuracy, speed and low cost are great, and to achieve such objects with a new system wherein the advantages of the different above-noted constructions are used.

BRIEF DESCRIPTION OF THE DRAWING

Various other objects, features and attendant advantages of the present invention will be more fully appreciated as the same becomes better understood from the following detailed description when considered in connection with the accompanying drawings, in which like reference characters designate like or corresponding parts through the several views and wherein.

DETAILED DESCRIPTION OF THE PREFERRED EMBODIMENTS

Figure 1:
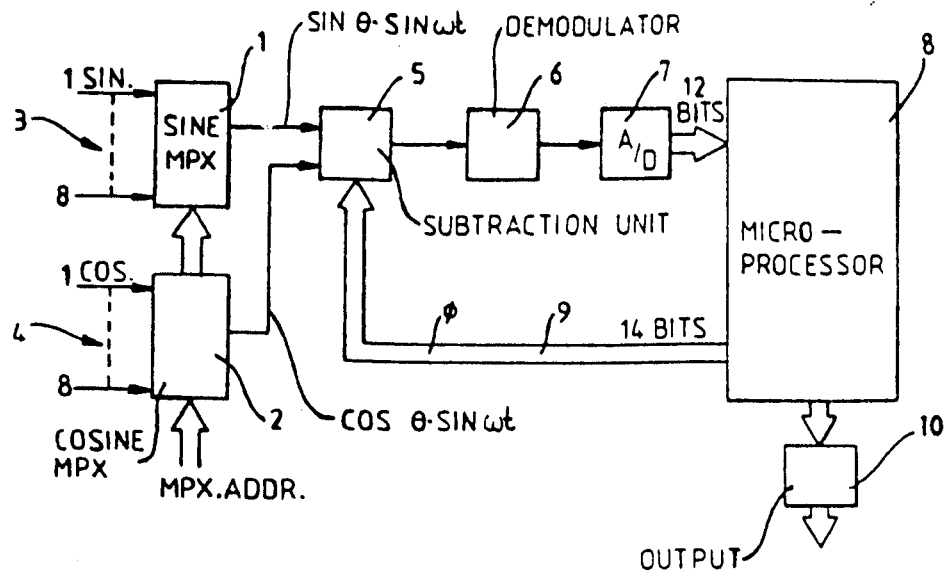
FIG. 1 is a block diagram of the device according to the invention.

In FIG. 1 there is shown input multiplexers 1, 2, for multiplexing the inputs 3 and 4, respectively. The input 3 has in the example shown the form $\sin \theta.\sin \omega t$ and input 4 has in the example the form $\cos \theta.\sin \omega t$, where $\theta$ is the turning angle of the resolver and $\omega$ is the angular frequency of the signal supplied to the resolver. The multiplexers are fed with a multiplex address MPX.ADR in order to be able to alternate between a number of channels, eight in the chosen example. There may of course be more or less than eight channels, depending upon the number of resolvers to be monitored. A subtraction unit 5 (SUB) has its two inputs connected to the respective multiplexers 1, 2.

Figure 2:
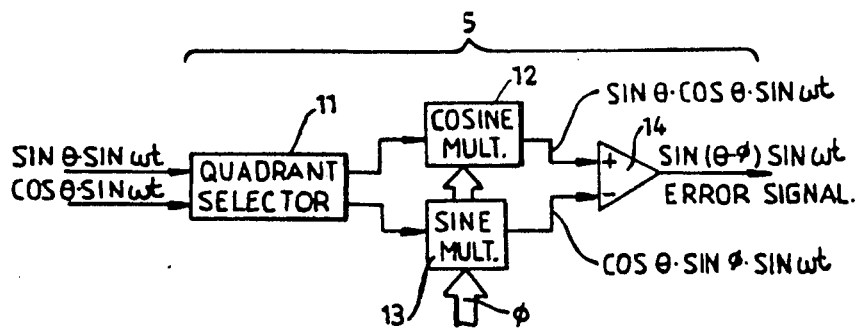
FIG. 2 is a solid-state control transformer which may constitute the subtraction unit incorporated in the device.

The subtraction unit 5 as shown in FIG. 2 may be a solid state control transformer corresponding to a part of a tracking-converter, namely quadrant selector 11, multipliers 12 and 13 for forming the cosine and sine of $\phi$, respectively, and difference amplifier 14.

Figure 5:
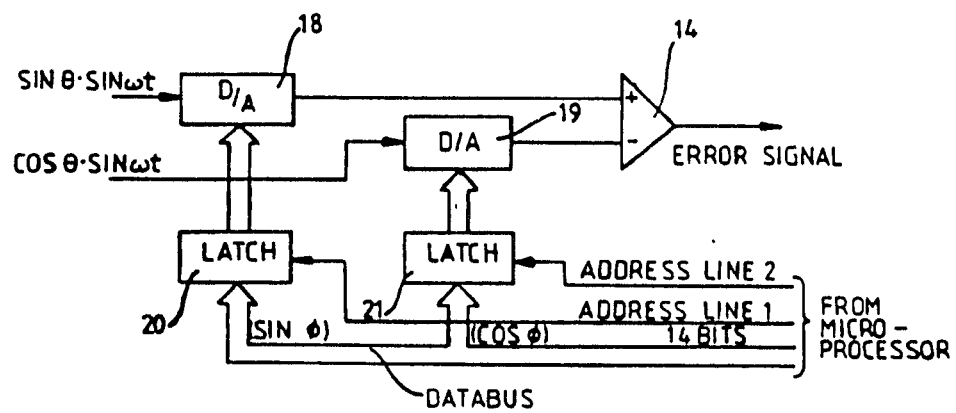
FIG. 5 is an alternative solution of the subtraction unit.

The multipliers 12 and 13 are special sine and cosine multipliers. Alternatively, as shown in FIG. 5 the multipliers may be conventional linear multiplying digital- to analogue converters 18, 19 which must be fed with sine $\phi$ and cosine $\phi$, respectively, through latches 20, 21 which are connected to a data bus and thereby to the micro-processor. In this case, it is the micro-processor which calculates sine $\phi$ and cosine $\phi$.

When the micro-processor 8 estimates a correct angular position, the theoretical error signal from the difference amplifier should be equal to zero.

Figure 3:
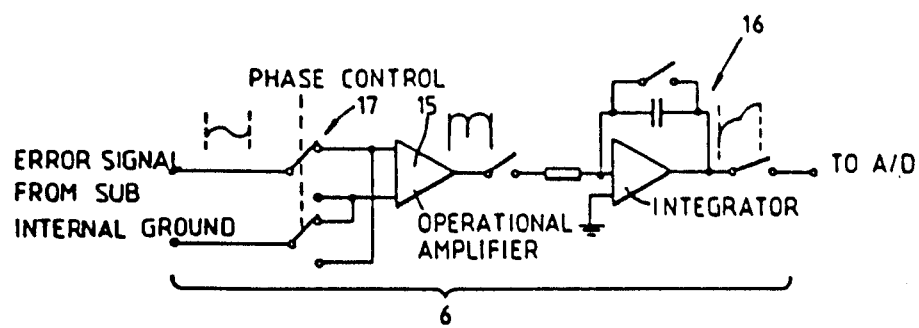
FIG. 3 is a demodulator incorporated in the device.

The output from the subtraction unit 5 is connected to a demodulator 6, which is shown in further detail in FIG. 3. The demodulator includes a commutator based on electronic switches 17, an operational amplifier 15, and an integrator 16 which may be zero set.

The output from the demodulator 6 is connected to an analgue/digital converter 7, the output of which feeds a micro-processor 8 with data representing sin ($\theta$-$\phi$) represented in a format of, for example, 12 bits.

Figure 4:
FIG. 4 illustrates as an example output signals from the control transformer during a measuring cycled.

The system may, according to a preferred embodiment, operate with up to 8 resolvers. Each of these are connected during a complete period of the carrier frequency by the input multiplexers. The carrier frequency may be e.g. 1 kHz. The subtraction unit 5 operates thereby one millisecond for each resolver. The digital input to the subtraction unit also obtains a new value for each period, such that the output signal from the subtraction circuit may look like that shown in FIG. 4.

The conversion operation for one channel of the device uses sampling points indicated by $(k-1)$, $(k)$, $(k+1)$ as the former, the present and the next sample, respectively. The angle of the resolver is $\theta$ and the estimated angle generated by the micro processor is $\phi$. After a period (1 ms) where the estimated value is $\phi(k-1)$, sin $[\theta-\phi(k-1)]$ is measured, denoted as sin $(\theta-\phi)$ $(k)$.

The micro processor 8 calculates $\phi(k)=f[\phi(k-1)],$ sin $[\theta-\phi)(k)]$ and the function sin $[(\theta-\phi)(k)]$ may in its simplest form be a negative summation of $\theta$ and $\phi$, since the sine of small angles is approximately equal to the angle itself. $\phi(k)$ will represent the resolver angle in digital form when the system has "moved into position".

Thus, the micro-processor provides a continuous calculation of the assumed correct position based on the regular data which is supplied. An output unit 10 is connected to micro-processor 8, from which unit the correct positional data may be further used.

Absolute measurement accuracy is limited by the subtraction unit, whereas the measurement resolution is not limited, since the error signal sin ($\theta$-$\phi$) is an ananlog signal. The subtraction unit may have 14 bits. Digital input and the A/D-converter for the error signal may provide 12 bits. The 12 bit signal represents a difference value which inherently does not require as fine a resolution as the absolute angle which is represented as a 14 bit value. Depending on the amplification in the demodulator, these 12 bits may represent the angular difference with high or small resolution. The limiting factor in this respect is the maximum speed of the resolver relative to the sampling frequency. High resolution is very important for stabilization of the servo systems. In the present system the resolution is e.g. one quarter of the resolution of the data word which the subtraction unit is fed with (here:$\phi$).

The system can compensate for velocity errors in the resolver and eliminate tracking errors at relative large velocities of the resolver. This is based on the forming of the function $\phi(k)$.

Dynamic accuracy is limited by the number of resolvers which are connected, but time delays in the measurement of each single resolver due to the multiplexing does not influence the measurement. This is due to the fact that sin $(\theta-\phi)$ $(k)$ is measured during the last period of the carrier frequency before calculation of $\phi(k)$ are made, even though $\phi(k-1)$ is e.g. "10 periods old".

The immunity to noise from the tracking converter is almost maintained, since the measurement takes place as an average over the complete period of the signals.

The system is economical as there is required one subtraction unit which is priced approximately equal to that of a tracking converter for up to 8 channels. The A/D-converter capacity is only used in an amount of 2.5%, enabling other analog measurements to be made (such as accelleration, power, velocity, pressure, temperature, position transmitters (DC or and the like), the micro-processor may be the same which controls the servo system. In addition there may be used economical conventional components.

Obviously, numerous modifications and variations of the present invention are possible in light of the above teachings. It is therefore to be understood that within the scope of the appended claims, the invention may be practiced otherwise than as specifically described herein.

I claim:

1. An apparatus for measuring the position of servo controlled mechanical members, such as manipulator members of industrial robots, comprising:

angular position transducer means including a plurality of synchros or resolvers associated with said mechanical members, said transducer means providing first and second modulated a.c. output signals respectively modulated in accordance with the sine and the cosine of an instantaneous angular position $\theta$ of said transducer means;

subtraction means for generating a difference signal based on said first and second modulated a.c. output signals from said transducer means, said difference signal representing a difference between $\theta$ of said transducer means and $\phi$, wherein $\phi$ denotes a desired corresponding angular position of said transducer means and wherein said subtraction means comprises:

quadrant selector means for receiving said modulated a.c. output signals from said transducer means;

first and second multiplying means for respectively multiplying said first and second modulated a.c. output signals from said quadrant selector means with second and third signals corresponding to sin $\phi$ and cos $\phi$, respectively, to provide first and second multiplied signals; and differential amplifier means having inputs connected to outputs of said first and second multiplying units for receiving said first and second multiplied signals;

demodulator means for demodulating said difference signal to form a demodulated difference signal;

multiplexing means for alternately connecting said transducer means to said subtraction means, said multiplexing means comprising a first multiplexer receiving from said transducer means said first modulated a.c. output signal and a second multiplexer for receiving from said transducer means said second modulated a.c. output signal;

signal evaluation means for receiving said demodulated difference signal and for transmitting to said subtraction means a signal representative of $\phi$, said signal evaluation means comprising an analog to digital converter connected to an output of said demodulator means, and a microprocessor connected to an output of said analog to digital converter for calculating said esired angular position $\phi$ based on the rate of change of the last sampled value of $\phi$; and data bus means for connecting said microprocessor to said first and second multiplying means and for transmitting from said microprocessor a digital value corresponding to $\phi$ to said first and second multiplying means wherein the position of the said servo controlled mechanical members is determined when $\phi$ is equal to $\theta$.

2. An apparatus for measuring the position of servo controlled mechanical members, such as manipulator members of industrial robots, comprising:

angular position transducer means including a plurality of synchros or resolvers associated with said mechanical members, said transducer means providing first and second modulator a.c. output signals respectively modulated in accordance with the sine and the cosine of an instantaneous angular position $\theta$ of said transducer means;

subtraction means for generating a difference signals based on said first and second modulated a.c. output signals from said transducer means, said difference signal representing a difference between $\theta$ of said transducer means, and $\phi$ wherein $\phi$ denotes a desired corresponding angular position of said transducer means, demodulator means for demodulating said difference signal to form a demodulated difference signal;

signal evaluation means including a microprocessor for receiving said demodulated difference signal and for calculating $\phi$ based on the rate of change of the last sampled value of $\phi$ and for transmitting to said subtraction means a signal representative of $\phi$;

multiplexing means for alternately connecting said transducer means to said subtraction means, said multiplexing means comprising a first multiplexer receiving from said transducer means said first modulated a.c. output signal and a second multiplexer for receiving from said transducer means said second modulated a.c. output signal; and said subtraction means further comprising:

first and second latch means connected to said microprocessor via a data bus means for latching digital values of sine $\phi$ and cosine $\phi$ as generated by said microprocessor;

first and second multiplying linear digital to analog converters respectively connected to said first and second latch means for converting said digital value from said microprocessor to an analog value and for subsequently multiplying said first modulated a.c. output signal by said sine value of $\phi$ and for subsequently multiplying said second modulated a.c. output signal by said cosine value of $\phi$; and differential amplifier means having inputs connected to outputs of said first and second multiplying linear digital to analog converters the position of the said servo controlled mechanical members angle is determined when $\phi$ is equal to $\theta$.

3. The apparatus of claim 2 wherein said demodulator means comprises first and second electronic switch means, amplifier means connected to said first and second electronic switch means and integrator means connected to said amplifier means.

* * * * *